(12) United States Patent
Yoshimoto

(10) Patent No.: US 8,421,555 B2
(45) Date of Patent: Apr. 16, 2013

(54) RECEIVING SIDE FILTER OF DUPLEXER AND DUPLEXER

(75) Inventor: Susumu Yoshimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 331 days.

(21) Appl. No.: 12/658,012

(22) Filed: Feb. 1, 2010

(65) Prior Publication Data

US 2010/0194488 A1 Aug. 5, 2010

(30) Foreign Application Priority Data

Feb. 2, 2009 (JP) .................................. 2009-21839

(51) Int. Cl.
*H03H 9/72* (2006.01)
*H03H 9/64* (2006.01)

(52) U.S. Cl.
USPC ......... 333/133; 333/193; 333/195; 310/313 B

(58) Field of Classification Search .................. 333/133, 333/193–196; 310/313 B, 313 D
See application file for complete search history.

(56) References Cited

U.S. PATENT DOCUMENTS

| | | | | |
|---|---|---|---|---|
| 5,874,869 | A * | 2/1999 | Ueda et al. | 333/193 |
| 6,946,929 | B2 * | 9/2005 | Ikeda et al. | 333/193 |
| 6,985,048 | B2 | 1/2006 | Takamine et al. | 333/133 |
| 7,030,716 | B2 * | 4/2006 | Tsutsumi et al. | 333/133 |
| 7,078,989 | B2 * | 7/2006 | Inoue et al. | 333/195 |
| 7,154,359 | B2 * | 12/2006 | Inoue et al. | 333/193 |
| 7,453,333 | B2 * | 11/2008 | Tanaka et al. | 333/195 |
| 7,579,928 | B2 * | 8/2009 | Otsuka et al. | 333/133 |
| 7,659,796 | B2 * | 2/2010 | Funami et al. | 333/133 |
| 7,684,764 | B2 * | 3/2010 | Iwamoto et al. | 455/76 |
| 2003/0085778 | A1 * | 5/2003 | Yata et al. | 333/186 |
| 2004/0080385 | A1 | 4/2004 | Takamine et al. | |
| 2004/0196119 | A1 | 10/2004 | Shibahara et al. | |
| 2005/0264375 | A1 | 12/2005 | Ikuta et al. | |
| 2005/0285700 | A1 | 12/2005 | Koga et al. | |
| 2009/0071711 | A1 | 3/2009 | Takano et al. | |

FOREIGN PATENT DOCUMENTS

| | | |
|---|---|---|
| CN | 1855709 | 11/2006 |
| EP | 1 394 941 | 3/2004 |
| EP | 1 453 198 | 9/2004 |
| JP | 2003-209456 | 7/2003 |
| JP | 2006-014096 | 1/2006 |
| JP | 2006-014296 | 1/2006 |
| WO | WO-03/069778 | 8/2003 |
| WO | WO-2006/003787 | 1/2006 |
| WO | WO-2007/052598 | 5/2007 |

* cited by examiner

*Primary Examiner* — Barbara Summons
(74) *Attorney, Agent, or Firm* — Jordan and Hamburg LLP

(57) ABSTRACT

To provide a receiving side filter of a duplexer and a duplexer capable of preventing a leakage of an electric field and a magnetic field to the outside. In a receiving side filter having a longitudinal mode resonator type filter including cross finger electrodes and reflectors respectively formed on a piezoelectric substrate and an unbalanced input signal path and balanced output ports respectively provided on an input side and on an output side of the longitudinal mode resonator type filter, and used on a receiving side of a duplexer, a shield electrode connected to a ground electrode side of the cross finger electrode is disposed to surround a periphery of the receiving side filter so that an electric field and a magnetic field leaked to the outside from the receiving side filter are short-circuited by the shield electrode.

4 Claims, 15 Drawing Sheets

Fig. 2
(a)
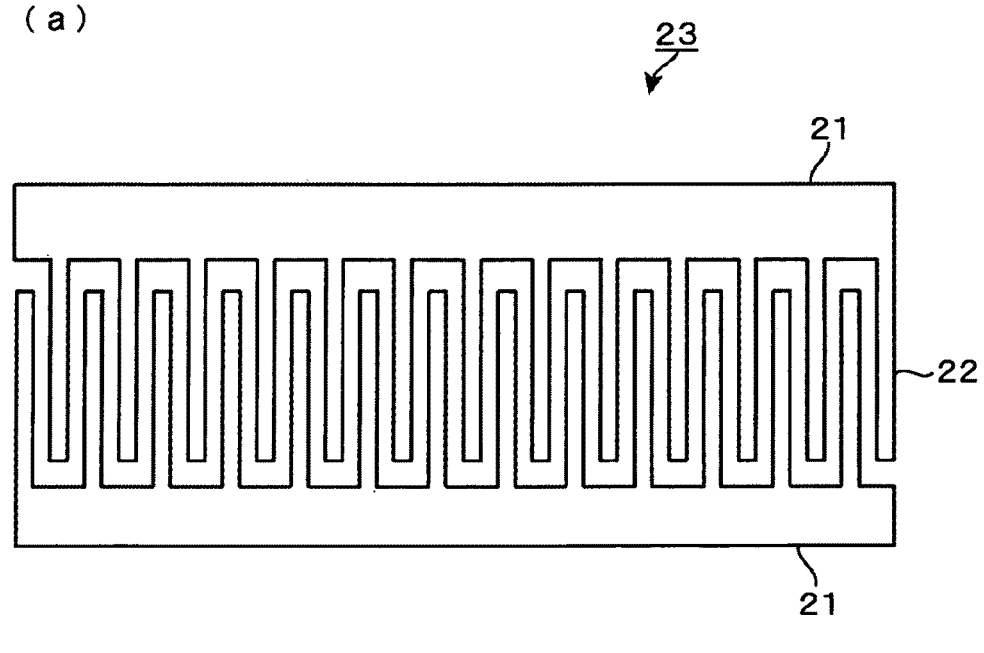
ELASTIC WAVE
(b)
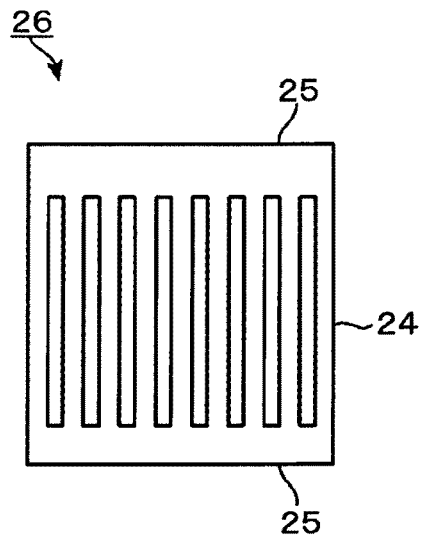

Fig. 4
(a) WHEN FILTER HAS BALANCED OUTPUT
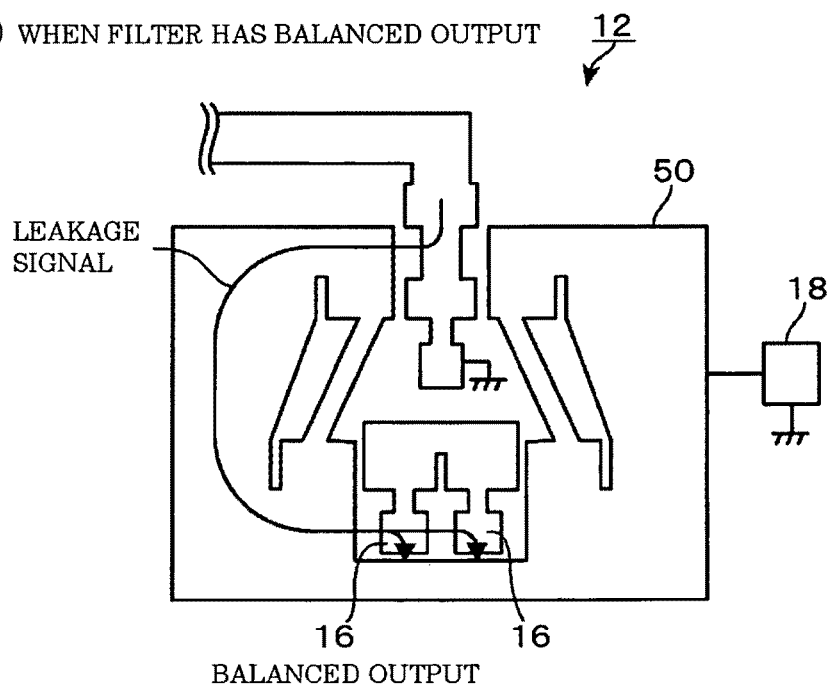
BALANCED OUTPUT
(b) WHEN FILTER HAS UNBALANCED OUTPUT
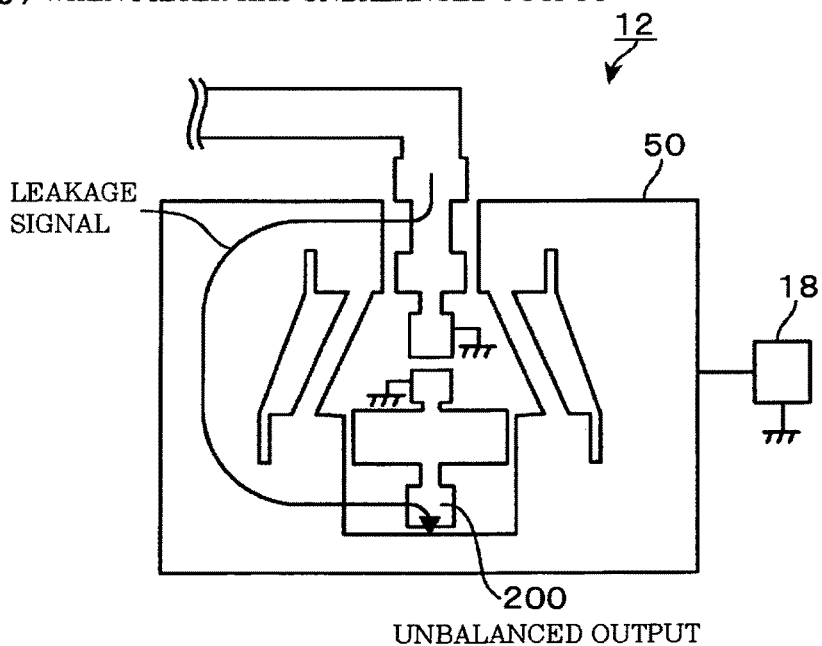
UNBALANCED OUTPUT

RECEIVING SIDE FILTER OF DUPLEXER AND DUPLEXER

BACKGROUND OF THE INVENTION

1. Field of the Invention

The present invention relates to a receiving side filter of a duplexer applied to, for example, a portable terminal device and the like.

2. Description of the Related Art

In recent years, requirement for an elastic wave duplexer having a balanced output as a receiving side output has been increasing. The reason is that a circuit using a balanced input has been increasingly used as a processing circuit of reception signal provided at a rear stage of receiving side filter. In such a case, it is common that a ladder-type filter in which a several stages of elastic wave resonators are connected in a serial-parallel manner and a longitudinal mode resonator type filter having an unbalanced-balanced conversion function are respectively used in a transmitting side circuit and in a receiving side circuit as circuits of elastic wave duplexer. FIG. 13 and FIG. 14 show an example of a conventional duplexer, in which 5 denotes an elastic wave resonator, 10 denotes a piezoelectric substrate, 11 denotes a ladder-type filter (transmitting side filter), 12 denotes a receiving side filter in which, for example, two balance-connected longitudinal mode resonator type filters 12a are connected, 13 denotes a phase shifter, 14 denotes an input/output port, 15 denotes a transmission input port, and 16 denotes a balanced output port.

In order to preferably maintain an isolation characteristic between the filters 11 and 12 in such a duplexer, a measure such as to increase a physical distance between the filters 11 and 12, to divide the filters 11, 12 as individual chips, or to additionally provide a metal shield 100 between the filters 11 and 12 as shown in FIG. 15, has to be taken. However, these methods have problems such that a size of device becomes large and the number of manufacturing steps and cost are increased in accordance with the half-division of the filters 11, 12, and besides, there is a disadvantage that a desired isolation characteristic cannot be obtained even if the above measures are taken. As will be shown in later-described FIG. 6, in the duplexer in FIG. 14, an increase in loss ascribable to an electromagnetic coupling between the filters 11 and 12 occurs in a transmission band in the vicinity of 830 MHz, and only 54 dB of attenuation amount is obtained as an effective value, so that the duplexer lacks performance as a duplexer for portable terminal device in recent years.

Although Patent Document 1 discloses a SAW filter using a surface wave, no study has been made regarding the aforementioned problems.

[Patent Document 1] Japanese Patent Application Laid-open No. 2003-209456 (FIG. 1, FIG. 8)

SUMMARY OF THE INVENTION

The present invention has been made based on such circumstances, and an object thereof is to provide, in a duplexer including a receiving side filter that realizes an unbalanced-balanced conversion function in a longitudinal mode resonator type filter, the receiving side filter and the duplexer capable of improving an isolation characteristic.

A receiving side filter of the present invention having a longitudinal mode resonator type filter including cross finger electrodes and reflectors respectively formed on a piezoelectric substrate and an unbalanced input signal path and balanced output ports respectively provided on an input side and on an output side of the longitudinal mode resonator type filter, and used on a receiving side of a duplexer, the receiving side filter is characterized in that it includes a shield electrode provided to surround the longitudinal mode resonator type filter and connected to a ground electrode.

As a concrete example, the aforementioned receiving side filter can also be structured as follows.

The shield electrode is structured to be opened at an area in which the unbalanced input signal path is provided.

The longitudinal mode resonator type filter is structured to include a first longitudinal mode resonator type filter whose input side is connected to the unbalanced input signal path and a second longitudinal mode resonator type filter whose input side is connected to an output side of the first longitudinal mode resonator type filter and whose output side is connected to the balanced output ports.

A duplexer of the present invention is characterized in that it includes a transmission circuit including elastic wave resonators, and a reception circuit including the aforementioned receiving side filter.

According to the present invention, in the receiving side filter having the longitudinal mode resonator type filter including the cross finger electrodes and the reflectors respectively formed on the piezoelectric substrate and the unbalanced input signal path and the balanced output ports respectively provided on the input side and on the output side of the longitudinal mode resonator type filter, and used on the receiving side of the duplexer, there is disposed the shield electrode provided to surround a periphery of the receiving side filter and connected to the ground electrode, so that an electric field and a magnetic field leaked to the outside from the receiving side filter can be short-circuited using the shield electrode. Therefore, in the duplexer using the receiving side filter, it is possible to lessen an influence of the electric field and the magnetic field on a transmission input port, resulting in that a preferable isolation characteristic can be obtained.

BRIEF DESCRIPTION OF THE DRAWINGS

FIGS. 2(a) and 2(b) are plan views schematically showing an IDT electrode and a reflector that form the aforementioned duplexer;

FIGS. 4(a) and 4(b) are schematic views schematically showing an operation in the aforementioned duplexer;

DETAILED DESCRIPTION OF THE PREFERRED EMBODIMENT(S)

Figure 1:
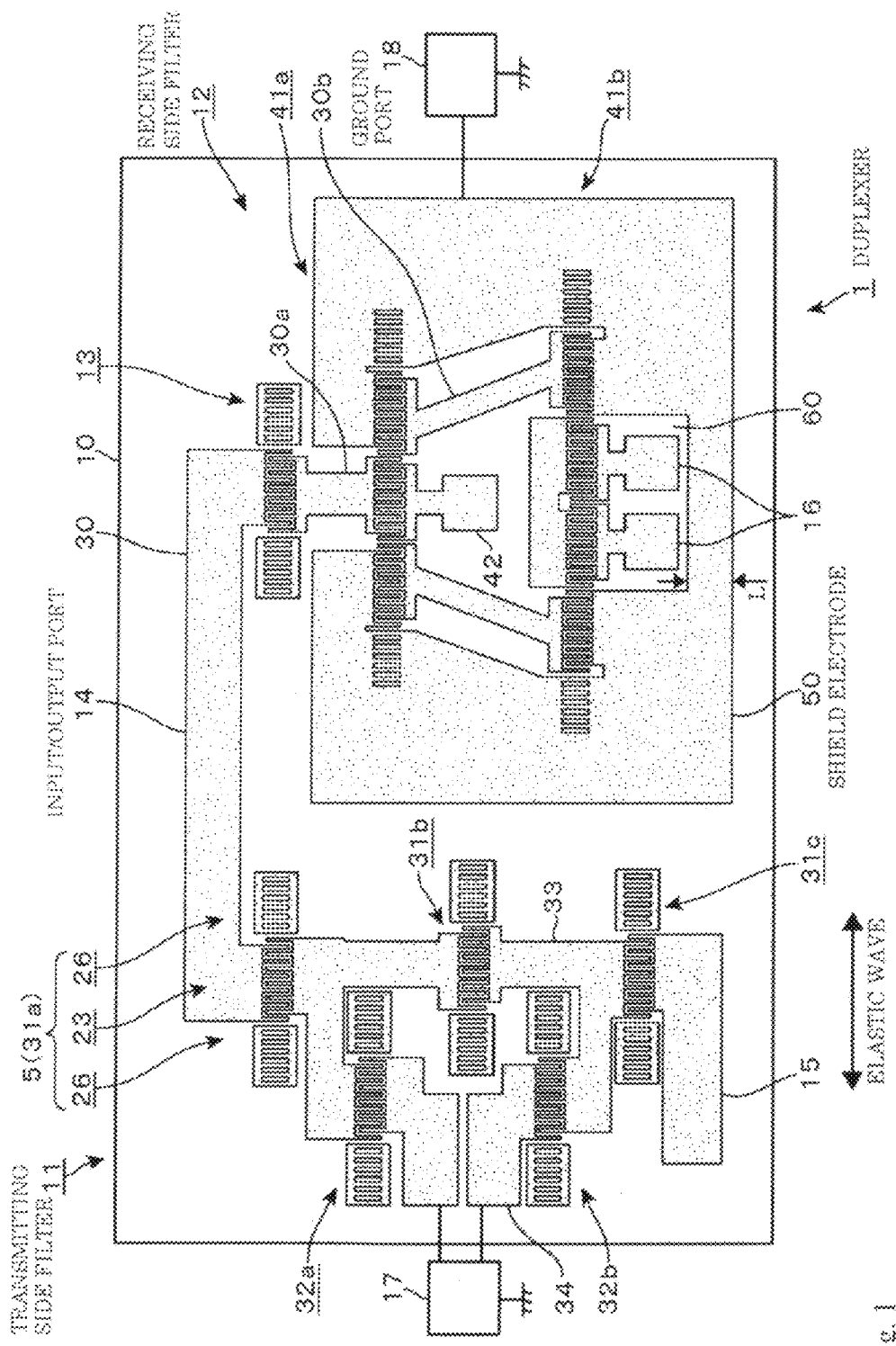
FIG. 1 is a plan view showing a structure example of a duplexer according to an embodiment of the present invention.
Figure 13:
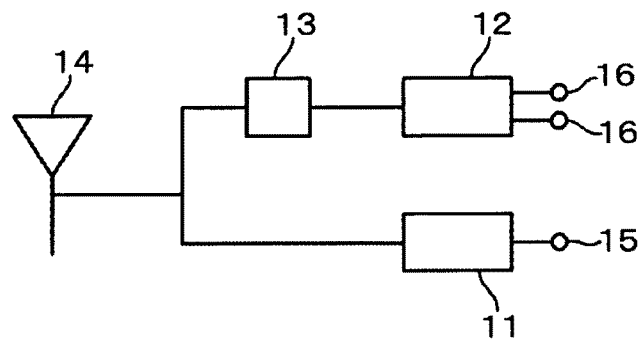
FIG. 13 is a schematic view schematically showing a duplexer.

An explanation on a duplexer (elastic wave duplexer) 1 being an embodiment of the present invention will be made with reference to FIG. 1. The duplexer 1 is formed on a piezoelectric substrate 10 formed of a piezoelectric material of, for instance, $LiTaO_3$, $LiNbO_3$, or quartz crystal, and includes a common input/output port 14 through which transmission/reception of signal is conducted, a transmitting side filter 11 being a transmission circuit that transmits signals to the input/output port 14, and a receiving side filter 12 being a reception circuit that receives the signals via the input/output port 14, as also shown in the aforementioned FIG. 13. Further, the input/output port 14 and the filters 11, 12 are connected to one another via a signal path 30. These filters 11, 12 are disposed on the left side and on the right side in a propagation direction of the elastic wave (horizontal direction in FIG. 1), respectively. The piezoelectric substrate 10 is disposed on a not-shown module substrate, and on the module substrate, ground ports 17, 18 being ground electrodes for grounding each of the filters 11, 12, and a not-shown antenna port connected to the input/output port 14 are provided. Note that the filters 11, 12, and the like are denoted by hatching, for easier discrimination.

The duplexer 1 is formed by, for instance, forming a metal film made of, for example, aluminum on an entire surface of the piezoelectric substrate 10, and subsequently performing, for example, etching on the filters 11, 12 and the metal film of an area around a later-described shield electrode 50 using photolithography. Therefore, the filters 11, 12 and the shield electrode 50 have the same film thickness of about 0.1 to 1.0 μm, for instance.

The aforementioned transmitting side filter 11 is a filter for filtering a transmission signal having a center frequency of 836.5 MHz, for example, and transmitting the signal from a not-shown transmission processing part in the device to the input/output port 14, and is formed of a filter in which elastic wave resonators 5 are connected in a ladder form. Concretely, in the transmitting side filter 11, three series arms 31a to 31c each formed of the elastic wave resonator 5 are serially connected in this order from the input/output port 14 side via a serial signal path 33, and parallel arms 32a, 32b similarly formed of the elastic wave resonators 5 are connected, in a parallel manner, between the series arms 31a and 31b and between the series arms 31b and 31c, respectively, via a parallel signal path 34, to thereby form five stages of T-type circuits.

As shown in FIG. 2, each of these series arms 31a to 31c and parallel arms 32a, 32b is composed of the elastic wave resonator 5 formed of an IDT (interdigital transducer) electrode 23 being a cross finger electrode and two reflectors 26, 26 disposed on both sides of the IDT electrode 23. The IDT electrode 23 is formed of two bus bars 21, 21 disposed in parallel to the propagation direction of the elastic wave, and a plurality of electrode fingers 22 extending in a comb-teeth shape from the bus bars 21, 21 so as to cross one another. Further, the reflector 26 is formed of two grating bus bars 25, 25 similarly disposed in parallel to the propagation direction of the elastic wave, and a plurality of grating electrodes 24 extending so as to connect the grating bus bars 25, 25. Further, through the aforementioned serial signal path 33 and parallel signal path 34, each of the bus bars 21, 21 of the respective IDT electrodes 23 is connected. Further, the bus bar 21 of the two bus bars 21, 21 of the series arm 31c positioned on the opposite side of the series arm 31b (input/output port 14) extends to an end area of the piezoelectric substrate 10 to form a transmission input port 15 to which a signal is input from the not-shown transmission processing part. Each of the bus bars 21 of the two bus bars 21, 21 of the respective parallel arms 32a, 32b positioned on the opposite side of the serial signal path 33 is connected to the aforementioned ground port 17. Note that FIG. 2 illustrates the electrode fingers 22 and the grating electrodes 24 by omitting the number thereof.

Next, the receiving side filter 12 of the present invention will be described. Between the receiving side filter 12 and the input/output port 14, a phase shifter 13 formed of the elastic wave resonator 5 is interposed to prevent the signal transmitted from the transmitting side filter 11 to the input/output port 14 from entering the receiving side filter 12. The receiving side filter 12 is a filter for filtering (selecting a frequency of) a reception signal having a frequency of 881.5 MHz, for example, and outputting the signal to a not-shown reception processing part in the device, and is formed of two longitudinal mode resonator type filters 41, 41. These longitudinal mode resonator type filters 41, 41 are disposed on a forward side and on a rearward side, respectively, so as to be orthogonal to the propagation direction of the elastic wave, and each of the filters is formed of a plurality of IDT electrodes 23 disposed along the propagation direction of the elastic wave and two reflectors 26, 26 provided to sandwich the IDT electrodes 23 from both sides.

If it is set such that one of the longitudinal mode resonator type filters 41, 41, which is, for example, the rearward-side longitudinal mode resonator type filter 41 close to the input/output port 14 is a first longitudinal mode resonator type filter 41a, and the other (forward-side) longitudinal mode resonator type filter 41 is a second longitudinal mode resonator type filter 41b, the first longitudinal mode resonator type filter 41a and the second longitudinal mode resonator type filter 41b include, for instance, three IDT electrodes 23 and four IDT electrodes 23, respectively.

To the rearward-side bus bar 21 of the center IDT electrode 23 in the first longitudinal mode resonator type filter 41a, an unbalanced input signal path 30a extending from the input/output port 14 (phase shifter 13) is connected, and through this signal path 30a, an unbalanced signal is input to the first longitudinal mode resonator type filter 41a. Further, to the forward-side bus bars 21, 21 of the IDT electrodes 23 of both sides, signal paths 30b, 30b extending to the second longitudinal mode resonator type filter 41b are respectively connected. To the forward-side bus bar 21 of the center IDT electrode 23, there is formed a ground electrode 42 connected to the aforementioned ground port 18 through an upper area of the piezoelectric substrate 10 using, for example, a bonding wire and the like. Further, to the rearward-side bus bars 21, 21 of the IDT electrodes 23, 23 of both sides, the later-described shield electrode 50 is connected.

To the rearward-side bus bars 21, 21 of the IDT electrodes 23 of both sides in the second longitudinal mode resonator type filter 41b, the signal paths 30b, 30b extending from the first longitudinal mode resonator type filter 41a are connected, and to each of the forward-side bus bars 21, 21 of these IDT electrodes 23, 23, the aforementioned shield electrode 50 is connected. Further, in the two IDT electrodes 23, 23 positioned on the center side in the second longitudinal mode resonator type filter 41b, each of the rearward-side bus bars 21, 21 is connected, and balanced output ports 16, 16 each outputting a signal received by the input/output port 14 to the not-shown reception processing part are respectively connected to the forward-side bus bars 21, 21. In the receiving side filter 12, the number of electrode fingers 22 of the IDT electrodes 23 in the longitudinal mode resonator type filters 41a, 41b and the like are adjusted so that amplitudes of signals respectively taken from the two balanced output ports 16, 16 become substantially the same, and phases of the signals differ by substantially 180°.

The aforementioned shield electrodes 50 extend rearward from the rearward-side bus bars 21, 21 of the IDT electrodes 23, 23 of both sides in the first longitudinal mode resonator type filter 41a along the signal path 30a between the first longitudinal mode resonator type filter 41a and the phase shifter 13, extend forward by surrounding an area of lateral sides of the first longitudinal mode resonator type filter 41a and the second longitudinal mode resonator type filter 41b (lateral side of the receiving side filter 12), and are coupled on the forward side of the second longitudinal mode resonator type filter 41b via the forward-side bus bars 21, 21 of the IDT electrodes 23, 23 of both sides in the second longitudinal mode resonator type filter 41b. Further, on the forward side of the second longitudinal mode resonator type filter 41b, the rearward of the shield electrode 50 is dented in a rectangular shape to form a recessed portion 60, so as not to contact with the balanced output ports 16, 16. A width size L of the shield electrode 50 in the recessed portion 60 is, for example, 10 μm to 100 μm, and is preferably about 100 μm or greater. The shield electrode 50 is formed to have the width size L along its circumferential direction that is the same or greater than the width size in the recessed portion 60.

Therefore, the filters 41a, 41b are surrounded by the shield electrode 50 along a whole circumference thereof except the signal path 30a and both side areas of the signal path 30a. Further, the shield electrode 50 is connected to the aforementioned ground port 18, and is disposed to have an outline that takes a roughly rectangular shape. In this example, the shield electrode 50 is connected to the grating bus bars 25, 25 of each of the two reflectors 26, 26 of the filters 41a, 41b, and accordingly, the shield electrode 50 connected to these reflectors 26, 26 close to the IDT electrodes 23, 23 of both sides in the filters 41a, 41b has a shape in which a plurality of slits are formed.

Figure 3:
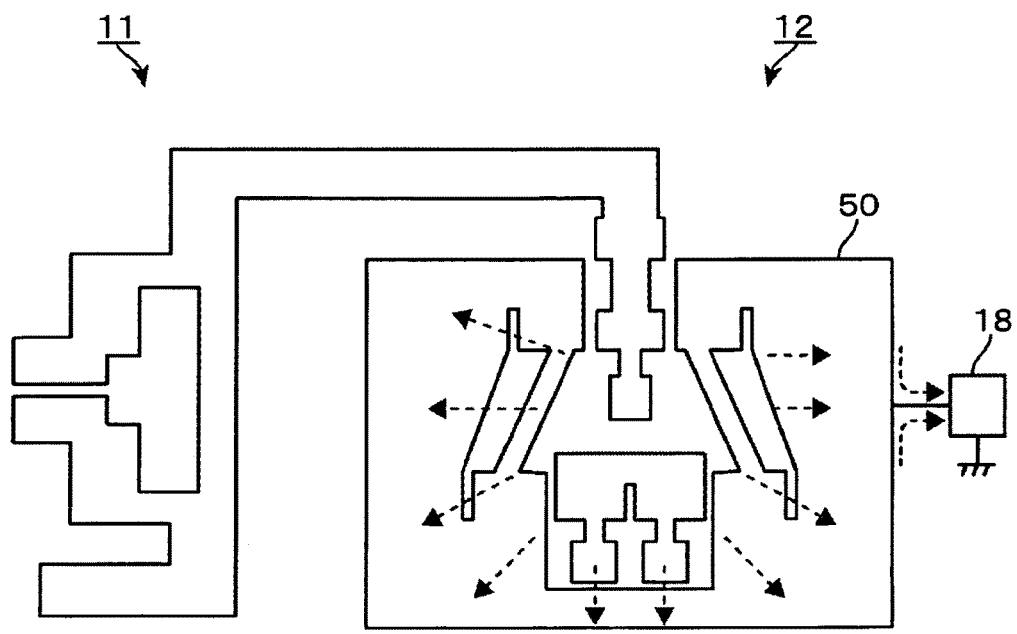
FIG. 3 is a schematic view schematically showing an operation in the aforementioned duplexer.

Next, an operation of the aforementioned embodiment will be described. A signal for transmission is transmitted from the transmission input port 15 to the input/output port 14 via the transmitting side filter 11, and is transmitted from a not-shown antenna. Meanwhile, a signal received by the antenna passes through the input/output port 14 and the phase shifter 13, enters the receiving side filter 12 from the signal path 30a being the unbalanced input port, and is output as a balanced signal to the balanced output ports 16, 16 to be sent to a not-shown signal processing part. At this time, an electric field and a magnetic field are generated from, for example, the electrode fingers 22 of the IDT electrodes 23, the signal paths 30a, 30b or the balanced output ports 16, 16 composing the receiving side filter 12, and the electric field and the magnetic field tend to leak to a lateral area of the receiving side filter 12. However, since the shield electrode 50 grounded to the ground port 18 is formed around the receiving side filter 12 and the electromagnetic field flows to the ground port 18 via the shield electrode 50 as shown in FIG. 3, it is possible to prevent the electric field and the magnetic field from being leaked to the outside of the receiving side filter 12, which is, for example, the transmitting side filter 11. Therefore, the influence of the electric field and the magnetic field generated in the receiving side filter 12 can be lessen in the transmission input port 15, which results in improving the isolation characteristic.

Here, when the receiving side filter 12 is of a type that outputs the unbalanced signal and the shield electrode 50 is provided, there is a chance that a signal directly transmitting to an unbalanced output 200 from the input/output port 14 via the shield electrode 50 is generated as shown in FIG. 4(b), which deteriorates the isolation characteristic. Meanwhile, when the receiving side filter 12 is of a type that outputs the balanced signal as in the present invention, even if a signal directly reaches the balanced outputs (balanced output ports 16, 16) as shown in FIG. 4(a), a differential output between the ports 16 and 16 can be obtained, so that the signal is canceled and the deterioration of the isolation characteristic does not practically occur.

Figure 5:
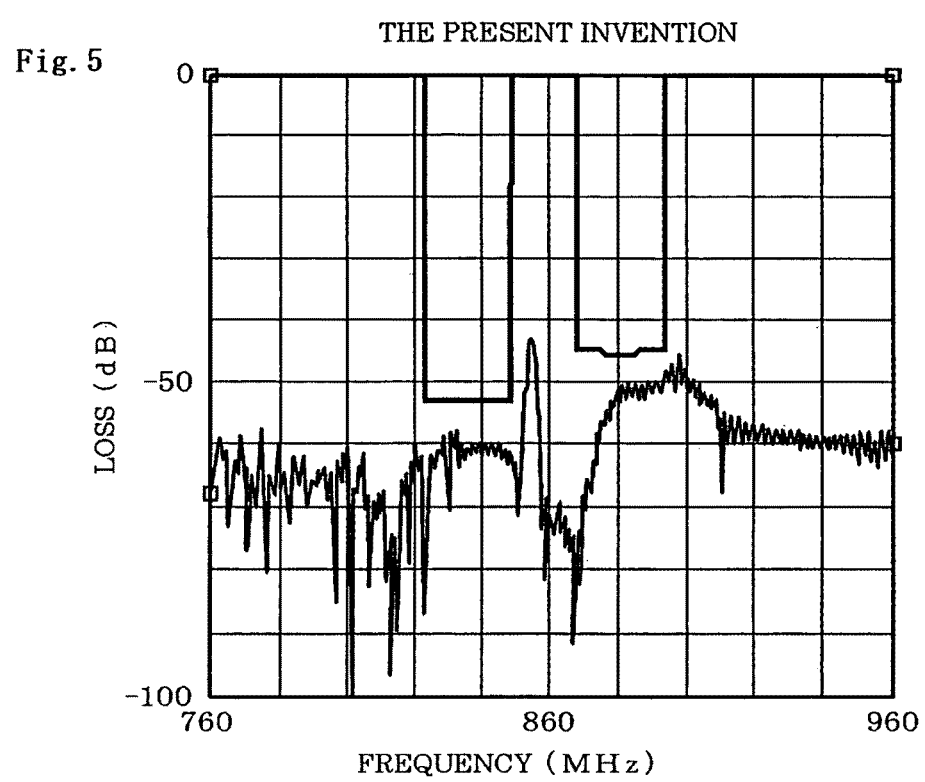
FIG. 5 is a characteristic diagram showing an example of an isolation characteristic obtained by the aforementioned duplexer.
Figure 6:
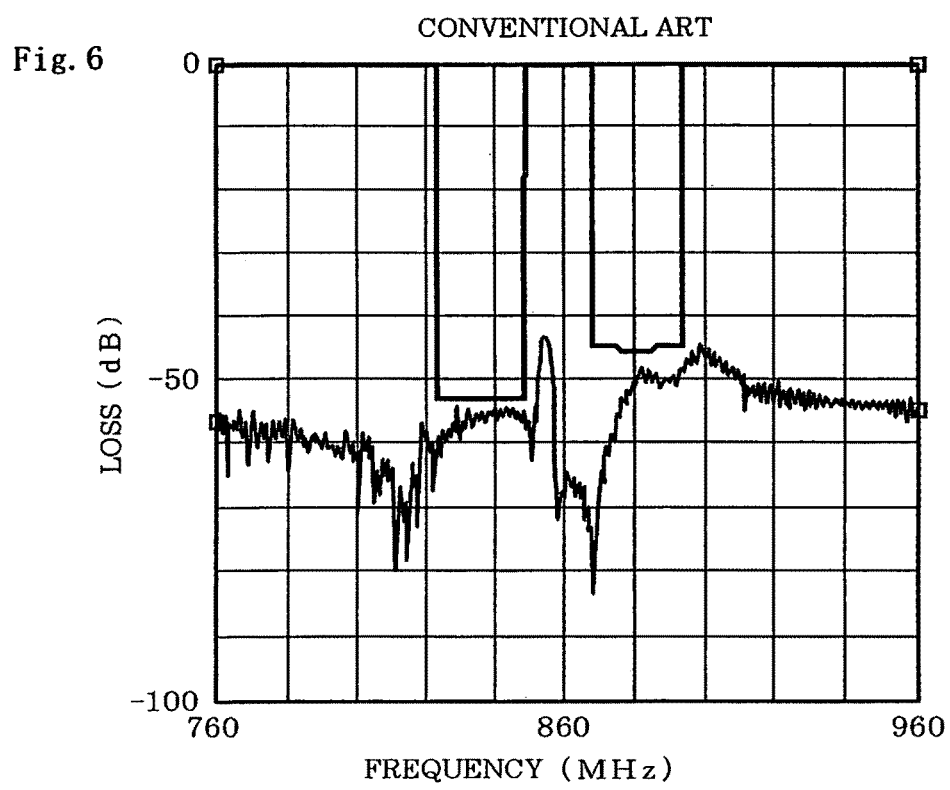
FIG. 6 is a characteristic diagram showing an isolation characteristic obtained by a conventional duplexer.
Figure 14:
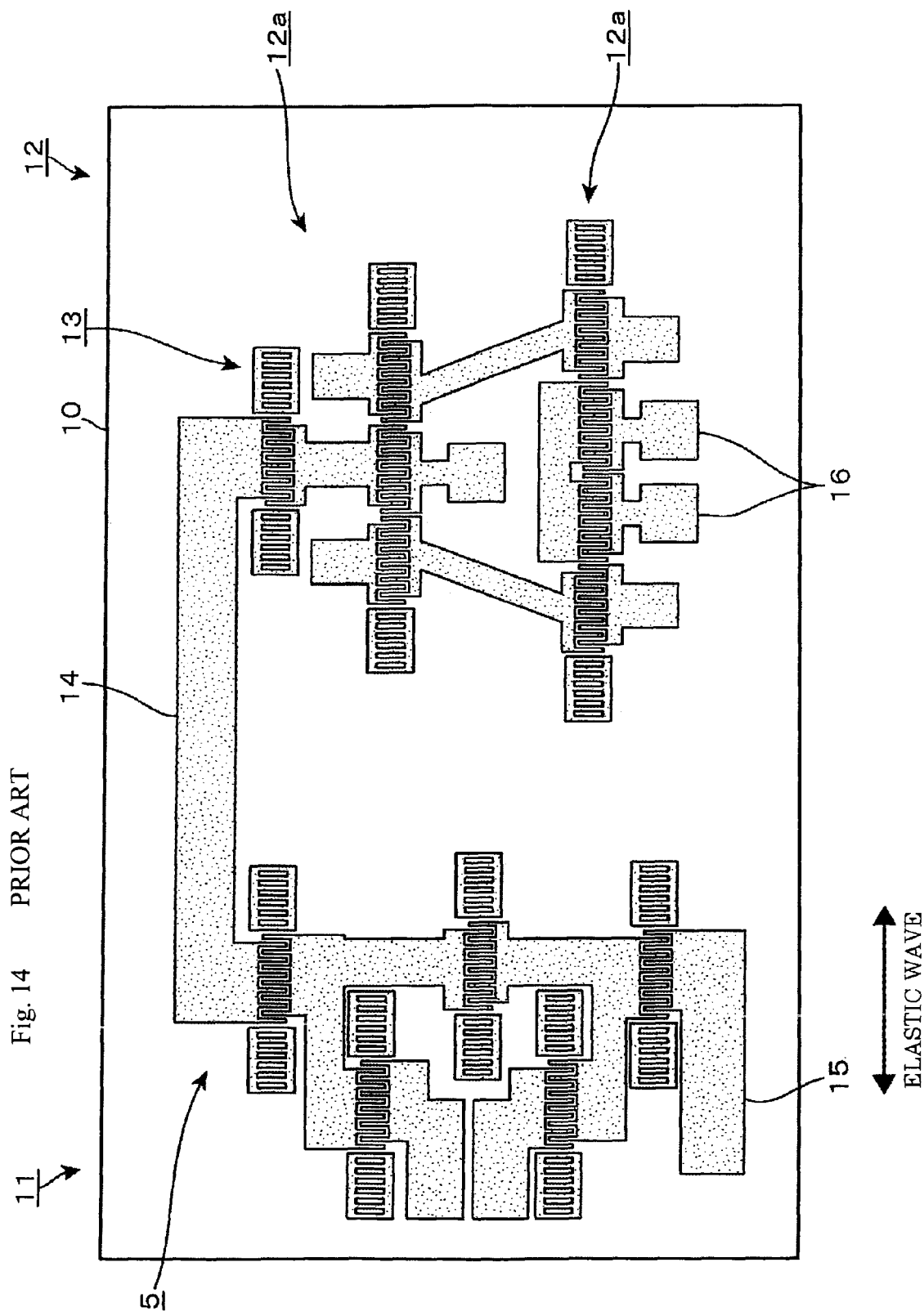
FIG. 14 is a plan view showing the conventional duplexer.
Figure 15:
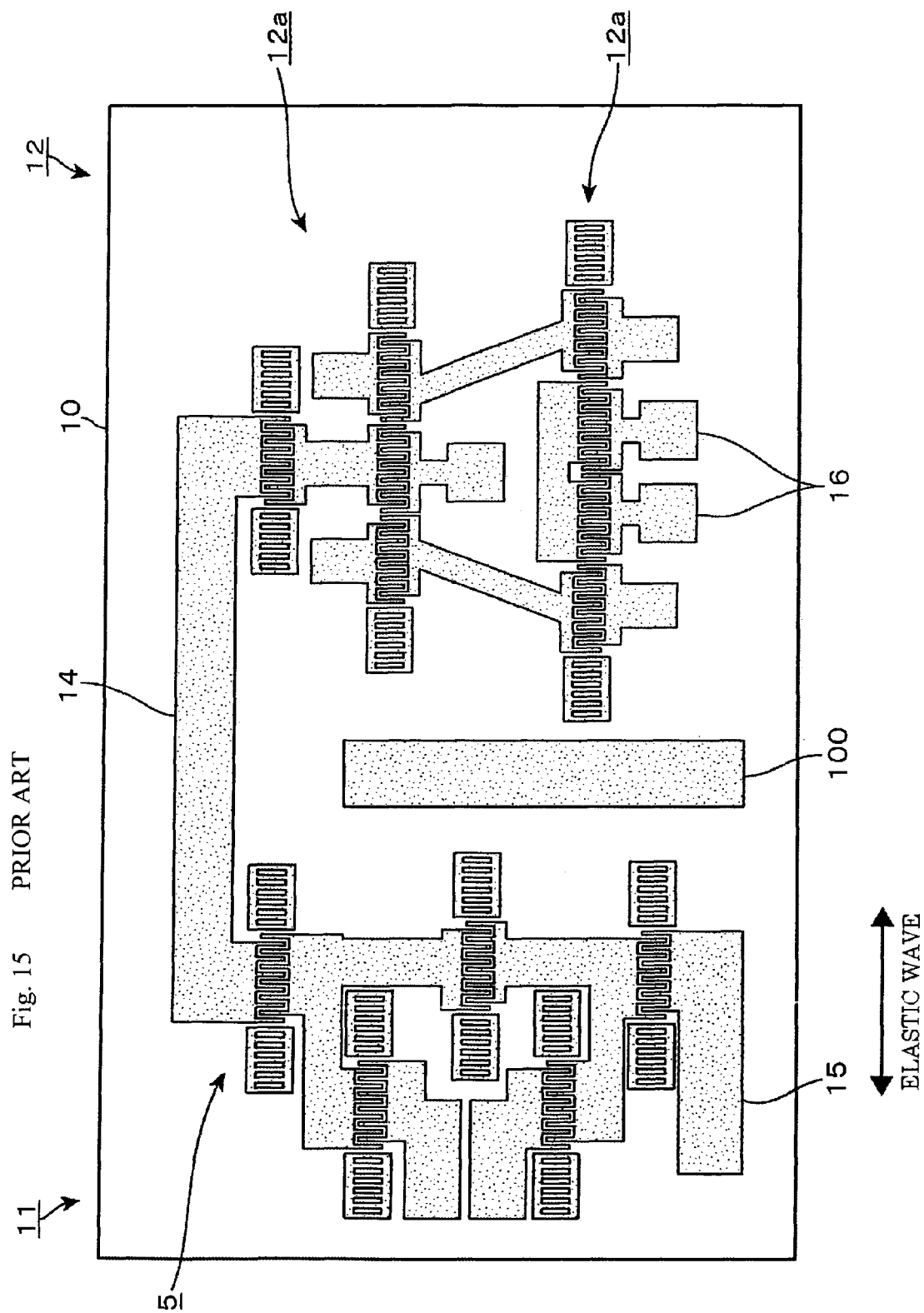
FIG. 15 is a plan view showing the conventional duplexer.

An isolation characteristic actually obtained by the duplexer 1 is shown in FIG. 5, and an isolation characteristic obtained by a conventional duplexer shown in FIG. 14 is shown in FIG. 6. From FIG. 5 and FIG. 6, it can be confirmed that the isolation characteristic is more improved in the duplexer 1 of the present invention than in the conventional duplexer. Concretely, it can be confirmed that a peak intensity in the vicinity of 870 MHz becomes smaller than the conventional one, and the isolation characteristic in the vicinity of 850 MHz, which is conventionally about 54 dB, is largely improved to about 60 dB.

According to the aforementioned embodiment, the grounded shield electrode 50 is disposed to surround the periphery of the receiving side filter 12, so that an unnecessary electric field and an unnecessary magnetic field leaked to the outside from the receiving side filter 12 can be short-circuited using the shield electrode 50. Therefore, in the duplexer 1 using the receiving side filter 12, the influence of the unnecessary emission on the transmission input port 15 can be lessen, resulting in that a preferable isolation characteristic can be obtained.

Accordingly, the filters 11, 12 can be closely disposed, which enables to realize a miniaturization of the duplexer 1.

In the above example, the aforementioned ground electrode 42 is directly connected to the ground port 18, but, it may also be connected to the shield electrode 50. Further, in the IDT electrodes 23 of both sides in the respective longitudinal mode resonator type filters 41a, 41b, the bus bars 21 which are not connected to the signal paths 30b are connected to the shield electrode 50, but, they may also be directly connected to the ground port 18 by, for example, bonding wires and the like without using the shield electrode 50, and may also be directly connected to a ground port other than the ground port 18.

Figure 7:
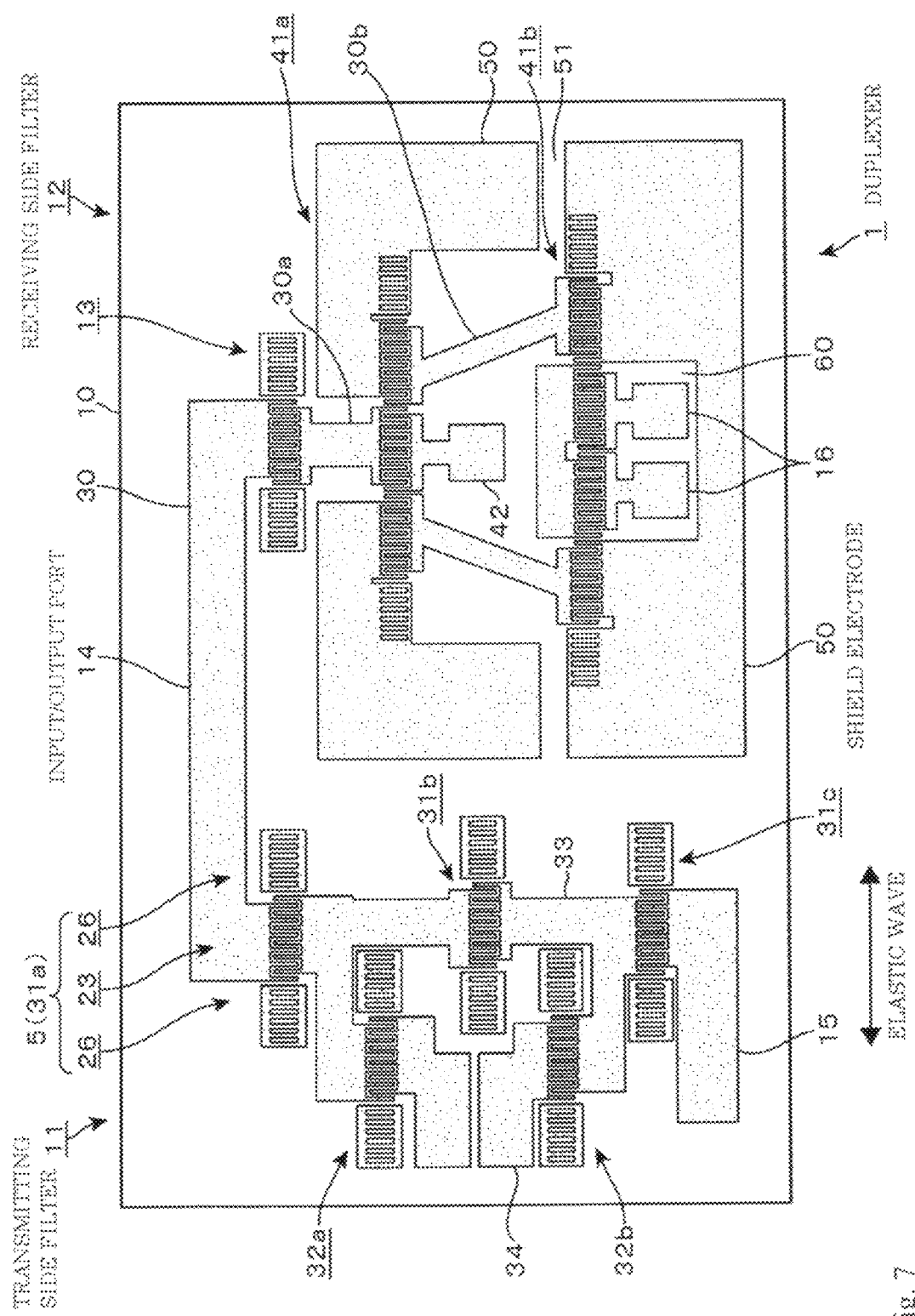
FIG. 7 is a plan view schematically showing an another example of the aforementioned duplexer.

In the above example, although the shield electrode 50 is provided to surround the whole circumference of the receiving side filter 12 except the both side areas of the signal path 30a, it is only required to surround the filter so that the electric field and the magnetic field generated in the receiving side filter 12 are prevented from entering the transmission input port 15, and it is also possible to form, for example, an opening 51 having a slit shape in the middle of the shield electrode 50, as shown in FIG. 7, for instance. Also in such a case, it is possible to lessen the influence of the electric field and the magnetic field entering the transmission input port 15. In order to lessen the influence of the electric field and the magnetic field entering the transmission input port 15, it is only required to form the opening 51 so that about 60% or more of the periphery of the receiving side filter 12 is surrounded by the shield electrode 50, for instance. Note that in FIG. 7, the illustration of ground ports 17, 18 is omitted. The same applies to the subsequent drawings.

Figure 8:
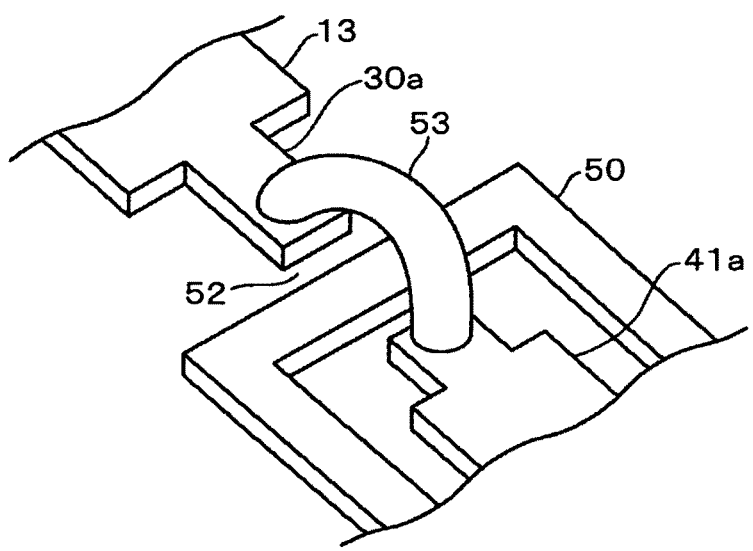
FIG. 8 is a plan view schematically showing a still another example of the aforementioned duplexer.

Further, in the above examples, there is provided a gap between the shield electrode 50 and the signal path 30a connecting the phase shifter 13 and the first longitudinal mode resonator type filter 41a, but, it is also possible that the signal path 30a is separated and disposed on a rearward side and on a forward side over a gap 52, left and right shield electrodes 50 are connected through the gap 52, and the phase shifter 13 and the first longitudinal mode resonator type filter 41a are connected by, for example, a bonding wire 53 and the like through an upper area of the piezoelectric substrate 10 (gap 52), as shown in FIG. 8. By disposing the shield electrode 50 as described above, the receiving side filter 12 is surrounded by the shield electrode 50 along the whole circumference thereof, so that the electric field and the magnetic field entering the transmission input port 15 can be further reduced. Note that in FIG. 8, the phase shifter 13 and the first longitudinal mode resonator type filter 41a are schematically illustrated.

Figure 9:
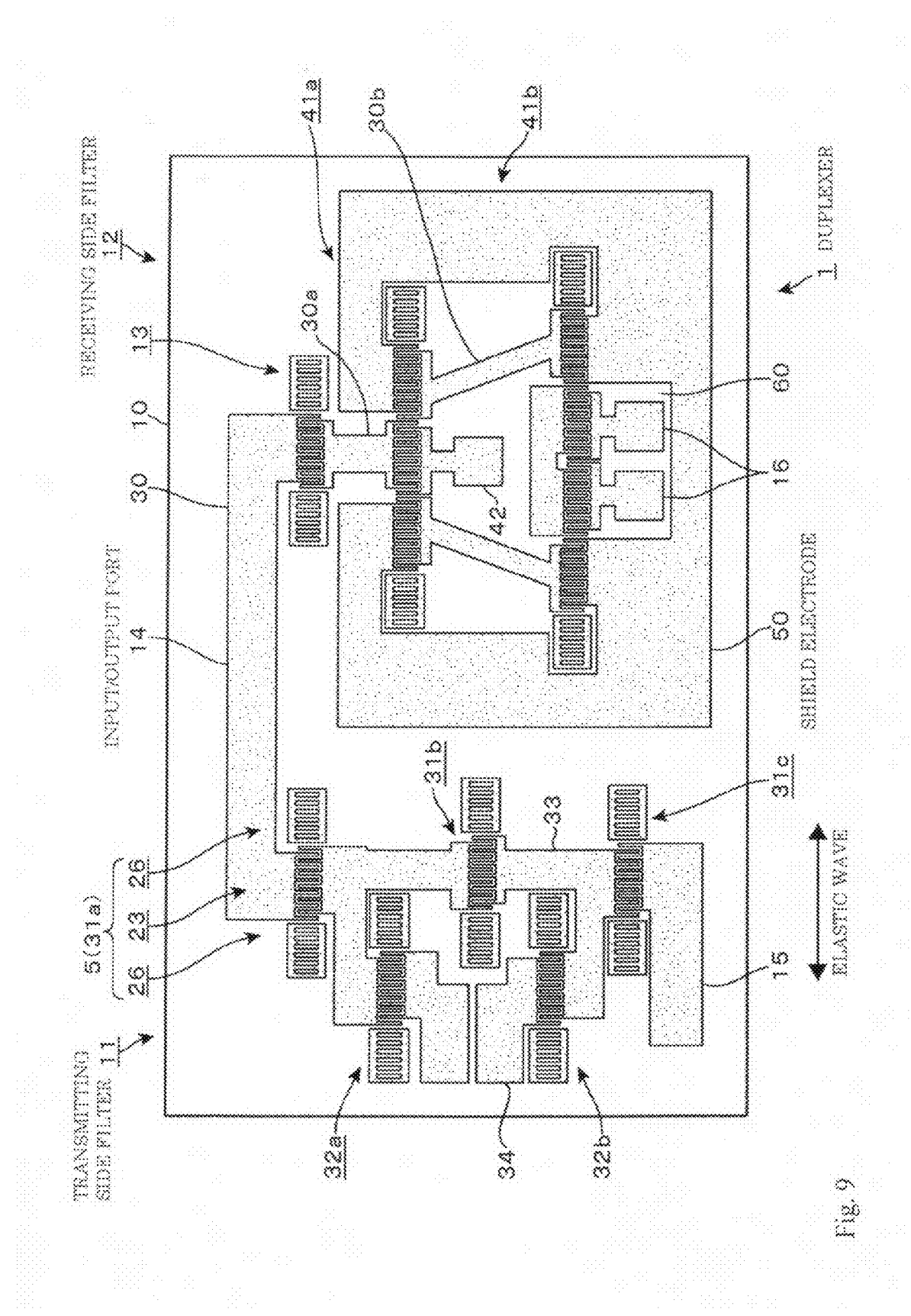
FIG. 9 is a plan view schematically showing a yet another example of the aforementioned duplexer.
Figure 10:
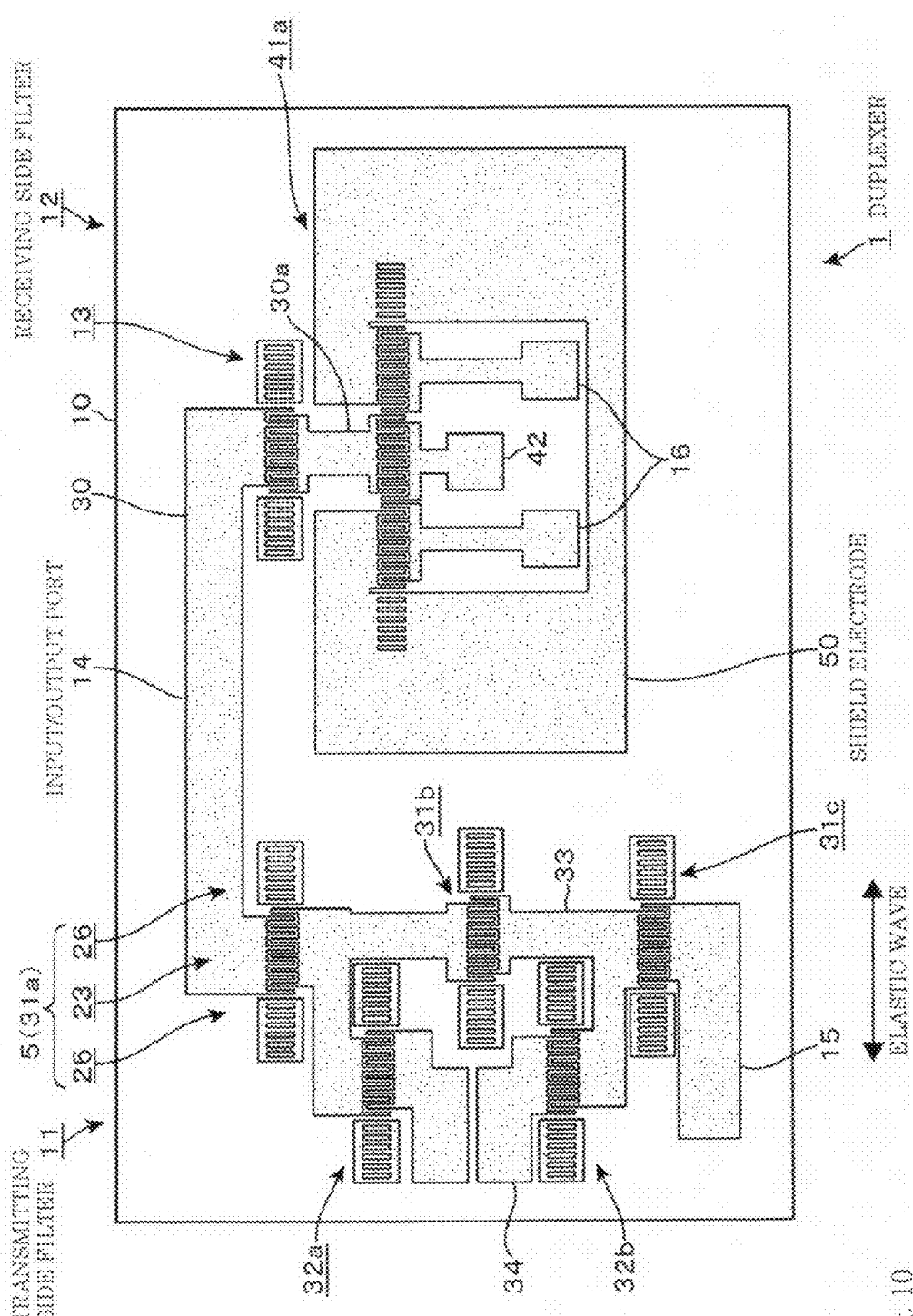
FIG. 10 is a plan view schematically showing a further example of the aforementioned duplexer.
Figure 11:
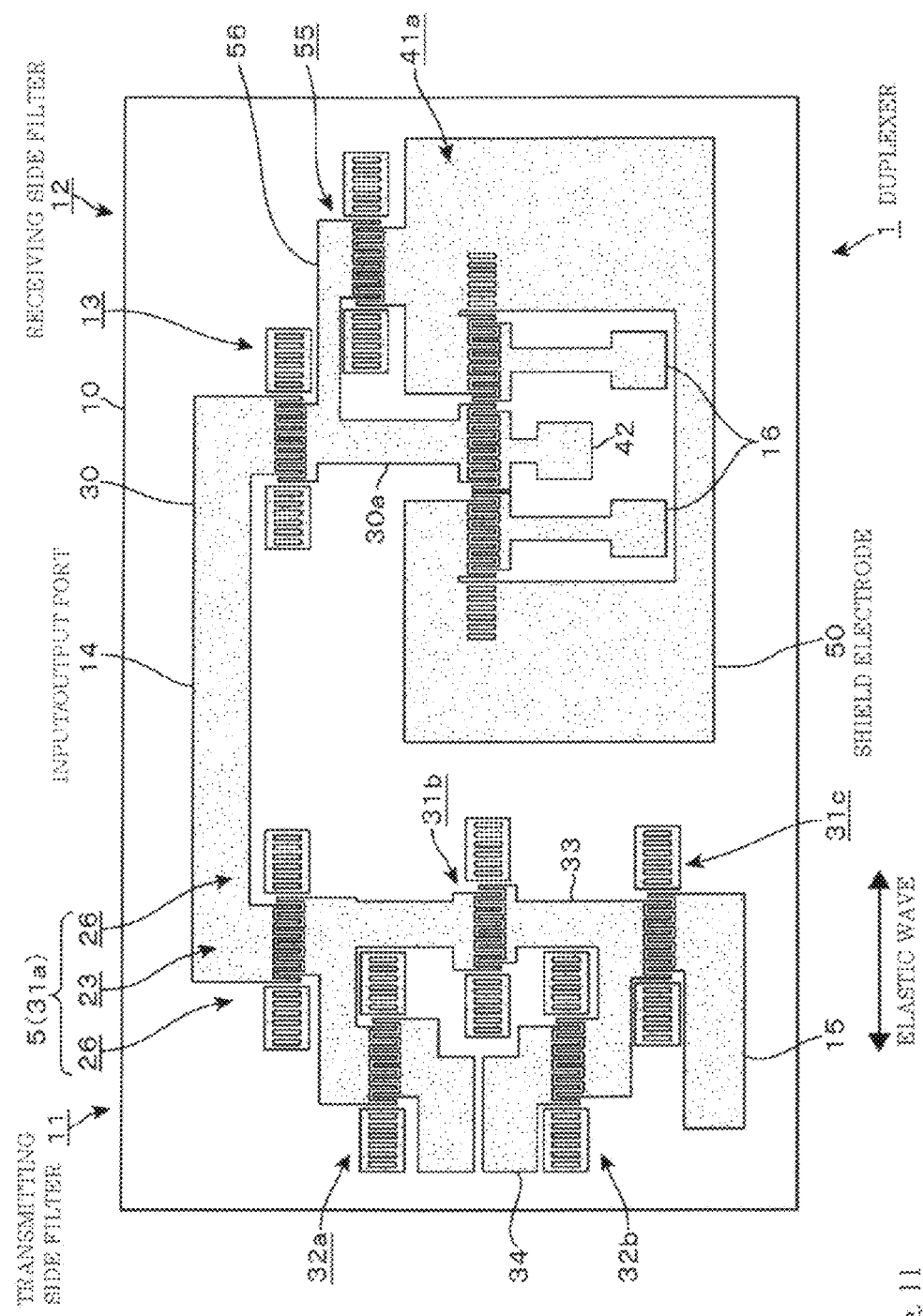
FIG. 11 is a plan view schematically showing a still further example of the aforementioned duplexer.

Further, although the shield electrode 50 and the reflector 26 are designed to be connected, it is also possible that a gap is provided between the shield electrode 50 and the reflector 26, to thereby dispose the reflector 26 in a so-called floating state, as shown in FIG. 9. Further, as the receiving side filter 12, there can be cited an example, other than the example of disposing the two longitudinal mode resonator type filters 41, 41, in which only one of the filters is disposed as shown in FIG. 10, or three (three stages) or more of the filters are connected. Furthermore, as a part of circuit of the receiving side filter 12, for example, an auxiliary elastic wave resonator 55 formed of, for instance, the elastic wave resonator 5 and the like, may also be disposed as shown in FIG. 11. In this case, it is also possible to connect the bus bar 21 being one of the two bus bars 21, 21 of the auxiliary elastic wave resonator 55 to the shield electrode 50. The auxiliary elastic wave resonator 55 is for improving an out-of-band attenuation amount of the filter, for example. Note that 56 in FIG. 11 denotes a parallel wire branched from the signal path 30a to the auxiliary elastic wave resonator 55. As above, the shield electrode 50 is used as a ground port for the auxiliary elastic wave resonator 55, which eliminates a necessity to additionally route through a ground wire, resulting in that a miniaturization of the duplexer 1 can be realized.

Figure 12:
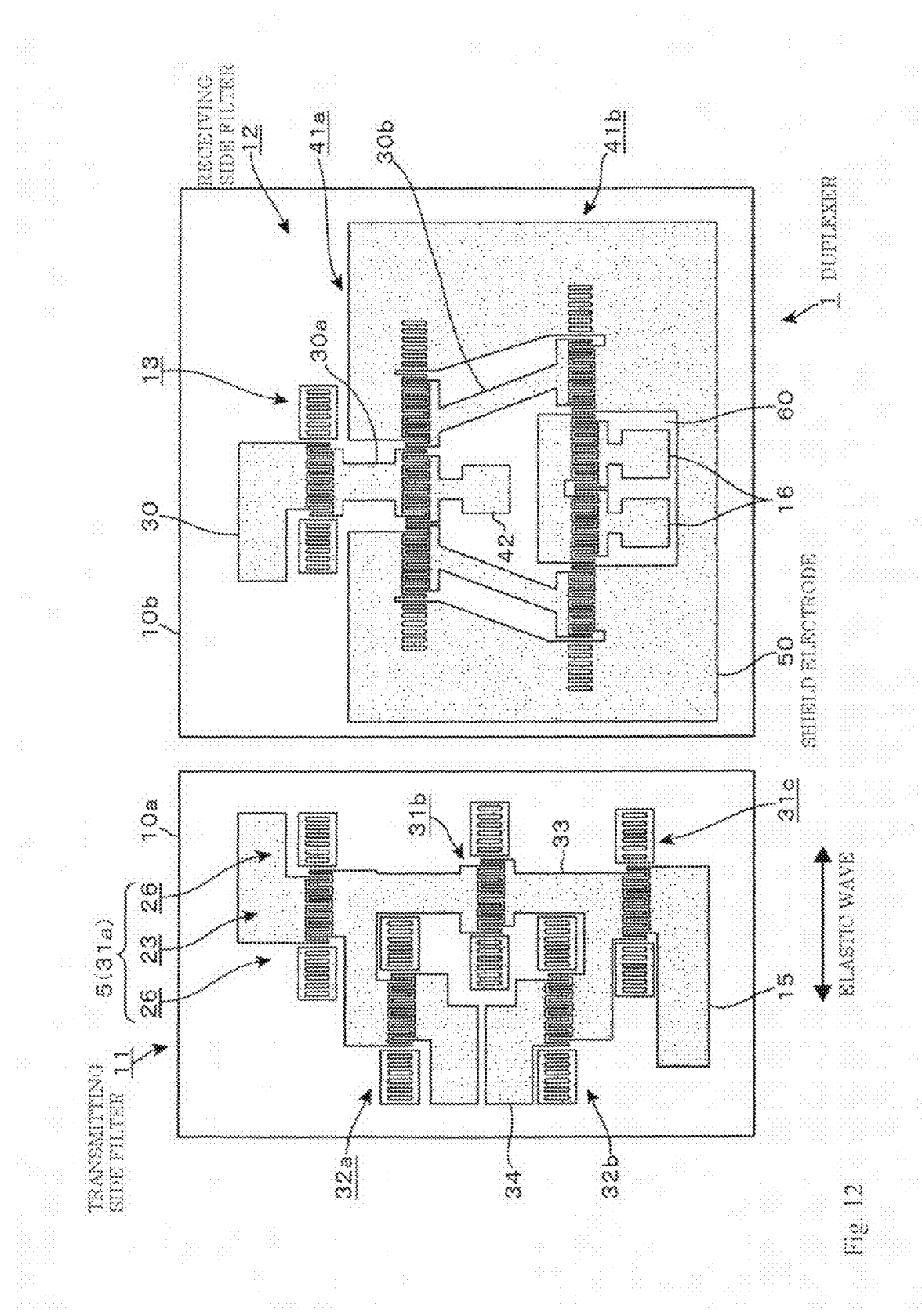
FIG. 12 is a plan view schematically showing a yet further example of the aforementioned duplexer.

Further, in the above-described respective examples, the filters 11, 12 are formed on one piezoelectric substrate 10, but, they may also be individually formed on piezoelectric substrates 10a, 10b, respectively, as shown in FIG. 12. In this case, the filters 11, 12 (piezoelectric substrates 10a, 10b) are respectively disposed on, for example, a not-shown module substrate or electronic component to form the duplexer 1. Further, the elastic wave resonator 5 using a surface acoustic wave is used as the transmitting side filter 11, but, it is also possible to use an elastic wave resonator utilizing thin film bulk wave such as, for instance, an FBAR (Film Bulk Acoustic Resonator) and an SMR (Solid Mounted Resonator). Further, the piezoelectric substrate 10 is only required to be a substrate having a piezoelectric function, and may also be realized by using, for instance, a substrate having a piezoelectric property, a substrate with no piezoelectric property on which a piezoelectric thin film is formed, a laminated substrate formed by laminating a plurality of piezoelectric thin films, a composite thin film substrate formed by interposing a non-piezoelectric thin film in the laminated substrate, and the like.

What is claimed is:

1. A duplexer comprising:
a receiving side filter having a longitudinal mode resonator type filter including cross finger electrodes and reflectors respectively formed on a piezoelectric substrate and an unbalanced input signal path provided on an input side of the longitudinal mode resonator type filter;
a pair of balanced output ports, arranged adjacent to each other in an area separated from said longitudinal mode resonator type filter, and connected to an output side of the longitudinal mode resonator type filter, via a conductive path;
a transmitting side filter provided on the piezoelectric substrate so as to be adjacent to the receiving side filter, and using an elastic wave resonator; and
a shield electrode, arranged following along a peripheral direction at, from among peripheral edges of said area, a peripheral edge other than a peripheral edge where said conductive path is arranged, and wherein the shield electrode is provided to surround from among the receiving side filter and transmitting side filter only a majority of the peripheral edge of the receiving side filter, and wherein said shield electrode is such that locations facing said area are constituted by a common electrode having a same potential.

2. The duplexer according to claim 1, wherein said shield electrode is opened at an area in which the unbalanced input signal path is provided.

3. The duplexer according to claim 1, wherein the longitudinal mode resonator type filter has a first longitudinal mode resonator type filter whose input side is connected to the unbalanced input signal path and a second longitudinal mode resonator type filter whose input side is connected to an output side of the first longitudinal mode resonator type filter and whose output side is connected to the balanced output ports.

4. The duplexer according to claim 1, wherein the shield electrode surrounds a majority portion of said pair of balanced output ports.

* * * * *